(12) United States Patent
Hayashi

(10) Patent No.: US 6,853,038 B2
(45) Date of Patent: Feb. 8, 2005

(54) SEMICONDUCTOR DEVICE AND METHOD FOR MANUFACTURING THE SAME

(75) Inventor: Masahiro Hayashi, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 10/383,167

(22) Filed: Mar. 6, 2003

(65) Prior Publication Data

US 2003/0209742 A1 Nov. 13, 2003

(30) Foreign Application Priority Data

Mar. 8, 2002 (JP) ........................................ 2002-063537

(51) Int. Cl.[7] .................... H01L 29/76; H01L 29/94; H01L 31/062; H01L 31/113; H01L 31/119
(52) U.S. Cl. ..................... 257/369; 257/371; 257/339; 257/500
(58) Field of Search .................... 438/275; 257/500, 257/501, 511, 512, 525, 355, 356, 339, 368, 369, 371

(56) References Cited

U.S. PATENT DOCUMENTS

| | | | | |
|---|---|---|---|---|
| 5,072,287 A | * | 12/1991 | Nakagawa et al. | .......... 257/500 |
| 5,473,183 A | * | 12/1995 | Yonemoto | .................... 257/371 |
| 5,475,335 A | * | 12/1995 | Merrill et al. | ............... 327/536 |
| 6,750,527 B1 | * | 6/2004 | Momohara | .................. 257/511 |
| 2002/0050619 A1 | * | 5/2002 | Kawaguchi et al. | ........ 257/368 |

FOREIGN PATENT DOCUMENTS

| | | |
|---|---|---|
| JP | 1-268171 | 10/1989 |
| JP | 7-78881 | 3/1995 |
| JP | 8-274268 | 10/1996 |
| JP | 2000-286346 | 10/2000 |
| JP | 2000-294742 | 10/2000 |
| JP | 2001-291678 | 10/2001 |
| JP | 2001-291679 | 10/2001 |
| JP | 2001-291786 | 10/2001 |

* cited by examiner

*Primary Examiner*—Mary Wilczewski
*Assistant Examiner*—Monica Lewis
(74) *Attorney, Agent, or Firm*—Harness, Dickey & Pierce, P.L.C.

(57) ABSTRACT

A semiconductor device and a method for manufacturing the same are provided having a high breakdown voltage transistor and a low breakdown voltage transistor with different driving voltages in a common substrate. The semiconductor device includes: a semiconductor substrate of a first conductivity type; a first well of a second conductivity type formed in the semiconductor substrate; a second well of the first conductivity type formed within the first well; a third well of the second conductivity type formed within the first well; a low breakdown voltage transistor of the second conductivity type formed at the second well; a low breakdown voltage transistor of the first conductivity type formed at the third well; and a high breakdown voltage transistor of the first conductivity type formed at the first well. The second well and the third well have an impurity concentration higher than an impurity concentration of the first well.

5 Claims, 9 Drawing Sheets

SEMICONDUCTOR DEVICE AND METHOD FOR MANUFACTURING THE SAME

TECHNICAL FIELD

The present invention relates to a semiconductor device having low breakdown voltage transistor and a high breakdown voltage transistor formed at different wells in a common semiconductor substrate and a method for manufacturing the same.

BACKGROUND

A liquid crystal panel driver LSI and a CCD driver LSI, for example, are operated at a power supply voltage of 10V or higher, and therefore high breakdown voltage transistors having a breakdown voltage of 20V or higher are normally required. On the other hand, low breakdown voltage transistors are used in internal control logic sections that need to be small in size and operated at high speeds. Wells where high breakdown voltage transistors are formed tend to be made deeper and their surface impurity concentrations tend to be made lower in order to secure the well breakdown voltage. In contrast, wells where low breakdown voltage transistors are formed tend to be made shallower and their surface impurity concentrations tend to be made higher in order to reduce the element size and to achieve higher speeds. For this reason, high breakdown voltage transistors are formed in a chip that is different from a chip for low breakdown voltage transistors, and are conventionally formed as an externally mounted circuit.

In view of the foregoing, one object of the present invention is to provide a semiconductor device having a high breakdown voltage transistor and a low breakdown voltage transistor with different driving voltages provided in a common substrate and a method for manufacturing the same.

SUMMARY

A semiconductor device in accordance with the present invention comprises:
  a semiconductor substrate of a first conductivity type;
  a first well of a second conductivity type formed in the semiconductor substrate;
  a second well of the first conductivity type formed within the first well;
  a third well of the second conductivity type formed within the first well;
  a low breakdown voltage transistor of the second conductivity type formed at the second well;
  a low breakdown voltage transistor of the first conductivity type formed at the third well; and
  a high breakdown voltage transistor of the first conductivity type formed at the first well,
  wherein the second well and the third well have an impurity concentration higher than an impurity concentration of the first well.

In the semiconductor device in accordance with the present invention, the second well and the third well where low breakdown voltage transistors are located are formed within the first well where high breakdown voltage transistors are formed. Therefore, the second well and the third well can be designed independently of the first well. As a result, even when a semiconductor device has high breakdown voltage transistors, the second well and the third well can be formed with their surface impurity concentrations being high to accommodate size-reduction and increased speeds of low breakdown voltage transistors. In particular, although the third well has the same conductivity type as that of the first well, its impurity concentration can be well defined from that of the first well, and its lateral well expansion can be controlled. Accordingly, the area of the second and third wells can be reduced, and therefore the degree of integration of these wells can be improved to higher levels.

Further, the impurity concentrations of the second well and the third well are set higher than the impurity concentration of the first well. By this, the impurity concentration of each well can be appropriately set according to the driving voltage and breakdown voltage of each transistor. A semiconductor device in accordance with the present invention can be provided with high breakdown voltage transistors driven by a power supply voltage of, for example, 10V or higher, and more particularly 20–60V, and low breakdown voltage transistors driven by a power supply voltage of, for example, 1.8–5V.

Also, since the second well and the third well are formed within the first well, low breakdown voltage transistors that are formed in the second and third wells are not restricted by the substrate potential, and can be driven by any desired power supply voltages.

The semiconductor device in accordance with the present invention may further include a fourth well of the first conductivity type formed in the semiconductor substrate, and a high breakdown voltage transistor of the second conductivity type formed at the fourth well.

In the semiconductor device in accordance with the present invention, a ratio of the breakdown voltages of the low breakdown voltage transistor and the high breakdown voltage transistor may be 3 to 60. Also, the high breakdown voltage transistor may have an offset gate structure.

A method for manufacturing a semiconductor device in accordance with the present invention comprises:
  (a) forming a first well of a second conductivity type in a semiconductor substrate of a first conductivity type;
  (b) introducing impurities of the first and second conductivity types by implanting ions in specified regions of the first well to form a first impurity layer and a second impurity layer; and
  (c) diffusing the impurities in the first impurity layer and the second impurity layer by a heat treatment to form a second well of the first conductivity type and a third well of the second conductivity type.

By the method in accordance with the present invention, since the first well where high breakdown voltage transistors are formed and the second well and third well where low breakdown voltage transistors are located are formed in different steps, the second well and third well can be designed independently of the first well.

Also, by the method in accordance with the present invention, by diffusing impurities in the first impurity layer and the second impurity layer by a heat treatment, the second well of the first conductivity type and the third well of the second conductivity type can be simultaneously formed.

In the method in accordance with the present invention, an impurity concentration of the second well and the third well can be made higher than an impurity concentration of the first well.

In the method in accordance with the present invention, a low breakdown voltage transistor of the second conductivity type may be formed at the second well, a low breakdown voltage transistor of the first conductivity type may be formed at the third well, and a high breakdown voltage transistor of the first conductivity type may be formed at the first well.

In the method in accordance with the present invention, a fourth well of the first conductivity type can be formed in the semiconductor substrate. Also, a high breakdown voltage transistor of the second conductivity type may be formed at the fourth well.

DETAILED DESCRIPTION

An embodiment of the present invention will be described below with reference to the accompanying drawings.
1. Semiconductor Device FIG. 1 schematically shows a cross-sectional view of a semiconductor device in accordance with the present embodiment.

Figure 1:
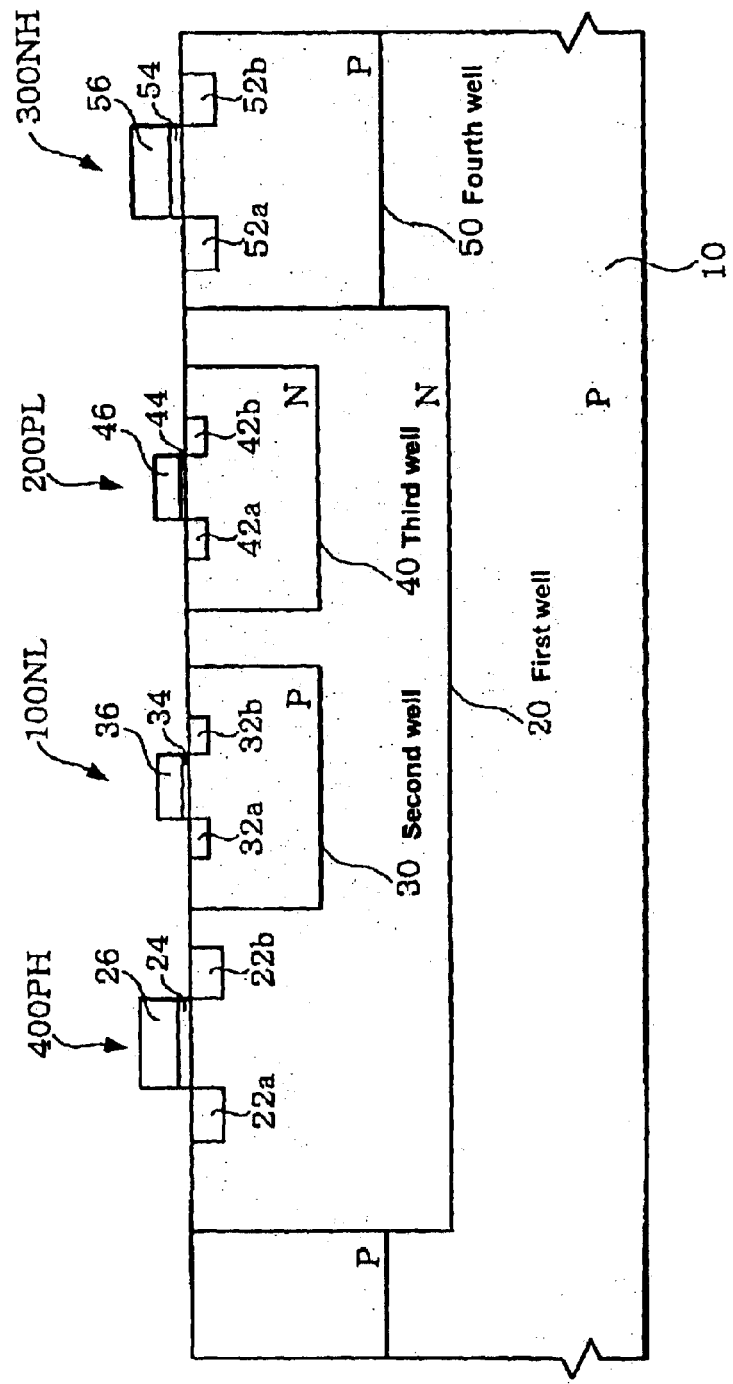
FIG. 1 schematically shows a cross-sectional view of the main parts of a semiconductor device in accordance with an embodiment of the present invention.

The semiconductor device shown in FIG. 1 includes a semiconductor substrate 10 (e.g., of silicon) of a first conductivity type (P-type in this example) in which a first well 20 of a second conductivity type (N-type in this example) and a P-type fourth well 50 are formed. The first well 20 and the fourth well 50 compose a so-called twin well.

A P-type second well 30 and an N-type third well 40 are formed within the first well 20. Low breakdown voltage transistors are formed in the second well 30 and the third well 40 that are shallower than the first well 20, and high breakdown voltage transistors are formed in the first well 20 and the fourth well 50.

More specifically, an N-channel type low breakdown voltage transistor 100NL is formed in the second well 30. The low breakdown voltage transistor 100NL includes source/drain layers 32a and 32b composed of N-type impurity layers, a gate dielectric layer 34 and a gate electrode 36.

A P-channel type low breakdown voltage transistor 200PL is formed in the third well 40. The low breakdown voltage transistor 200PL includes source/drain layers 42a and 42b composed of P-type impurity layers, a gate dielectric layer 44 and a gate electrode 46.

An N-channel type high breakdown voltage transistor 300NH is formed in the fourth well 50. The high breakdown voltage transistor 300NH includes source/drain layers 52a and 52b composed of N-type impurity layers, a gate dielectric layer 54 and a gate electrode 56.

A P-channel type high breakdown voltage transistor 400PH is formed in the first well 20. The high breakdown voltage transistor 400PH includes source/drain layers 22a and 22b composed of P-type impurity layers, a gate dielectric layer 24 and a gate electrode 26.

In accordance with the present embodiment, the low breakdown voltage transistors 100NL and 200PL are driven by a driving voltage of, for example, 1.8–5V. The high breakdown voltage transistors 300NH and 400PH are driven by a substantially higher driving voltage compared to those of the low breakdown voltage transistors 100NL and 200PL, for example, by a driving voltage of 20–60V. A ratio of the breakdown voltages between the low breakdown voltage transistor 100NL, 200PL and the high breakdown voltage transistor 300NH, 400PH, i.e., (a breakdown voltage of a high breakdown voltage transistor)/(a breakdown voltage of a low breakdown voltage transistor) is, for example, 3–60. The "breakdown voltage" typically means a drain breakdown voltage.

The structure of each of the wells is determined based on breakdown voltage and threshold value of transistors provided in each well and junction breakdown voltage and punch-through breakdown voltage between the wells.

Impurity concentrations of the wells will now be described. The impurity concentration of the second well 30 and third well 40 where low breakdown voltage transistors are formed is set higher than the impurity concentration of the first well 20 and the fourth well 50 where high breakdown voltage transistors are formed. The impurity concentration of the second well 30 and third well 40 is, for example, $4.0 \times 10^{16}$–$7.0 \times 10^{17}$ atoms/cm$^3$ in their surface concentration. The impurity concentration of the first well 20 and the fourth well 50 is, for example, $8.0 \times 10^{15}$–$4.0 \times 10^{16}$ atoms/cm$^3$ in their surface concentration.

With respect to the well depth, in view of the well breakdown voltage, the second well 30 and the third well 40 where low breakdown voltage transistors are located are formed shallower than the first well 20 and the fourth well 50 where high breakdown voltage transistors are formed. For example, the first well 20 has a depth of 10–20 μm, and the second well 30 and the third well 40 have a depth of 3–10 μm. As the depth of the first well 20 and the depth of the second well 30 and the third well 40 are compared, a depth ratio of the two is for example 2–5, respectively.

The transistors shown in FIG. 1 are isolated from one another by element isolation dielectric layers (not shown). Also, each of the high breakdown voltage transistors 300NH and 400PH may have a so-called offset gate structure in which the gate electrode does not overlap the source/drain layers. In an example described below, each high breakdown voltage transistor has a LOCOS offset structure. More specifically, in each of the high breakdown voltage transistors, an offset region is provided between a gate electrode and the source/drain layers. The offset region is composed of a low concentration impurity layer below the offset LOCOS layer that is provided in a specified region on the semiconductor substrate.

Figure 8:
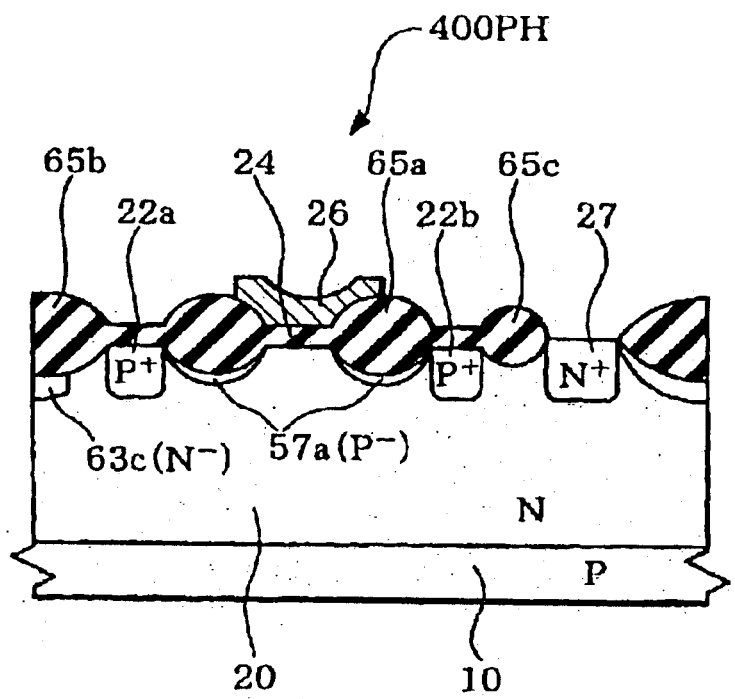
FIG. 8 shows a cross-sectional view of an exemplary structure of a high breakdown voltage transistor of a semiconductor device in accordance with an embodiment of the present invention.
Figure 9:
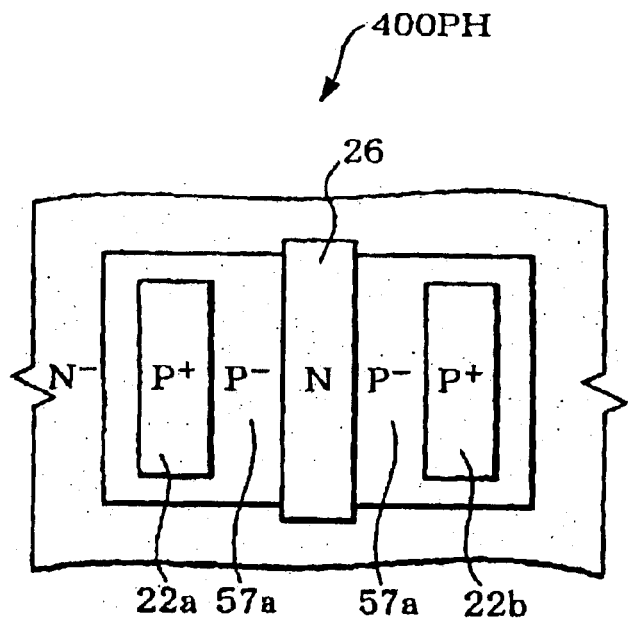
FIG. 9 shows a plan view of the main portions of the high breakdown voltage transistor shown in FIG. 8.

FIG. 8 shows, as an example of the offset gate structure, a cross-sectional view of the structure of the high breakdown voltage transistor 400PH. FIG. 9 shows a plan view of the main sections of the high breakdown voltage transistors 400PH.

The P-channel type high breakdown voltage transistor 400PH includes a gate dielectric layer 24 provided over the N-type first well 20, a gate electrode 26 formed over the gate dielectric layer 24, an offset LOCOS layer 65a provided around the gate dielectric layer 24, an offset impurity layer 57a composed of a P-type low concentration impurity layer that is formed below the offset LOCOS layer 65a, and source/drain layers 22a and 22b provided on the outside of the offset LOCOS layer 65a.

The high breakdown-strength transistor 400PH and its adjacent transistor are electrically isolated from each other by an element isolation LOCOS layer 65b (element isolation dielectric layer). Further, a channel stopper layer 63c composed of an N-type low concentration impurity layer is formed below the element isolation LOCOS layer 65b within the N-type first well 20 as shown in the drawing. A well contact layer 27 is isolated from the source/drain layer 22b by the LOCOS layer 65c. A channel stopper layer (not shown) can be formed below the LOSOC layer 65c.

In accordance with the present embodiment, each of the high breakdown voltage transistors has a LOCOS offset structure and therefore has a high drain breakdown voltage, such that a high breakdown voltage MOSFET can be composed. In other words, by providing the offset impurity layer 57a composed of a low concentration impurity layer below the offset LOCOS layer 65a, the offset impurity layer 57a can be made relatively deep against the channel region, compared to a case without the offset LOCOS layer. As a result, when the transistor is in an OFF state, a deep depletion layer can be formed because of the offset impurity layer 57a, and a drain breakdown voltage can be increased as the electric field adjacent to the drain electrode is alleviated.

In the semiconductor device in accordance with the present invention, the second well 30 and the third well 40 where the low breakdown voltage transistors 100NL and 200PL are located are formed within the first well 20 where the high breakdown voltage transistor 400PH is formed. Therefore, as described below, the first well 20, the second well 30 and the third well 40 are formed by a drive-in technique with different heat treatments. For this reason, the second well 30 and the third well 40, and their well depths in particular, can be designed independently of the first well 20. As a result, the amount of well expansion of the second well 30 and the third well 40 in a lateral direction can be reduced to accommodate size-reduction and increased speeds of low breakdown voltage transistors. Accordingly, the area of the wells can be reduced, and therefore the degree of integration of the second and third wells 30 and 40 can be improved to higher levels.

Also, the impurity concentration in the second well 30 and the third well 40 is set higher than the impurity concentration in the first well 20. As such, the impurity concentration of each well can be appropriately set according to the driving voltage and breakdown voltage of each transistor.

Figure 10:
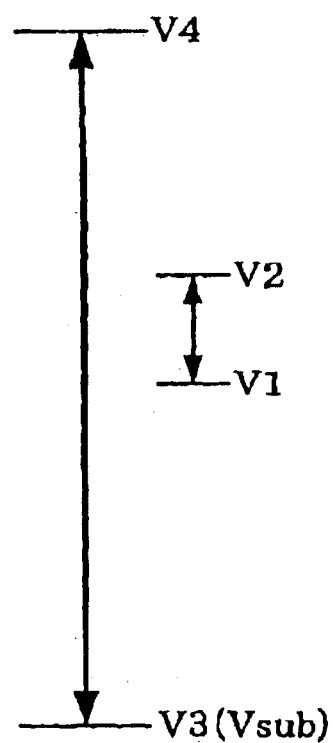
FIG. 10 shows the relations between driving voltages among the transistors in the semiconductor device in shown in FIG. 1.

Also, since the second well 30 and the third well 40 are formed within the first well 20, they are electrically isolated from the semiconductor substrate 10. As a result, bias conditions can be independently set for the second well 30 and the third well 40. In other words, driving voltages can be set for the second well 30 and the third well 40 independently of the substrate potential Vsub of the semiconductor substrate 10. Therefore, for example, as shown in FIG. 10, by setting driving voltages V1 and V2 for the low breakdown voltage transistors 100NL and 200PL intermediate between driving voltages V3 and V4 for the transistors 300NL and 400PL, a level shift circuit that converts a driving voltage level for a low breakdown voltage transistor to a driving voltage level for a high breakdown voltage transistor can be effectively and readily designed.

MANUFACTURING PROCESS

Next, a method for manufacturing a semiconductor device in one example of the present invention will be described. FIGS. 2-7 schematically show cross-sectional views concerning a method for manufacturing a semiconductor device shown in FIG. 1.

Figure 2:
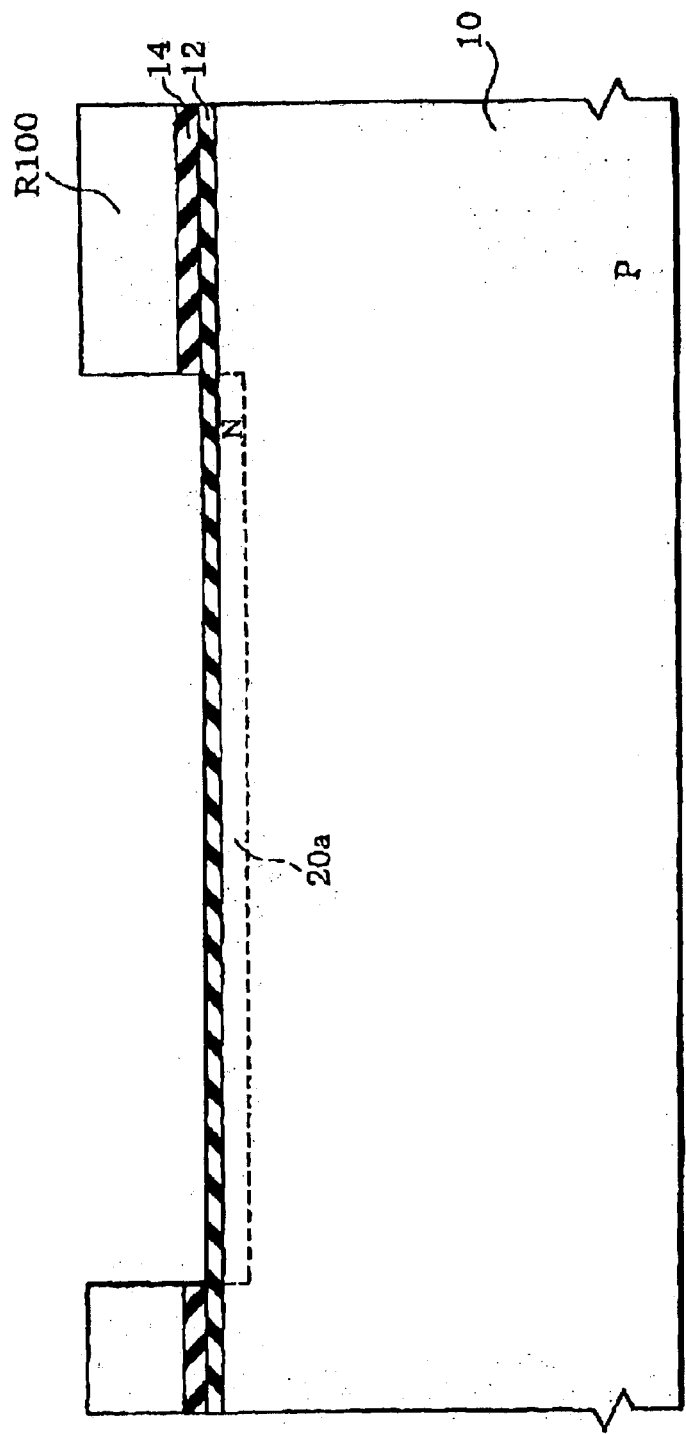
FIG. 2 shows a cross-sectional view indicating a method for manufacturing a semiconductor device in the process order in accordance with an embodiment of the present invention.

(A) As shown in FIG. 2, a P-type semiconductor substrate 10 (e.g., of silicon) is thermally oxidized to form a silicon oxide layer 12 having a thickness of about 40 nm on a surface of the semiconductor substrate 10. Then, a silicon nitride layer 14 having a thickness of 140–160 nm as an anti-oxidation layer is formed on the silicon oxide layer 12. Then, a resist layer R100 is formed on the silicon nitride layer 14. The resist layer R100 is patterned such that an opening section is formed therein at a position corresponding to an N-type first well 20 (see FIG. 1). Then, the silicon nitride layer 14 is etched using the resist layer R100 as a mask. Then, for example, phosphorus ions are implanted in the semiconductor substrate 10 using the resist layer R100 and the silicon nitride layer 14 as a mask to form an N-type impurity layer 20a. In this instance, the phosphorus ions can be implanted with an acceleration voltage of 120 KeV, for example.

Figure 3:
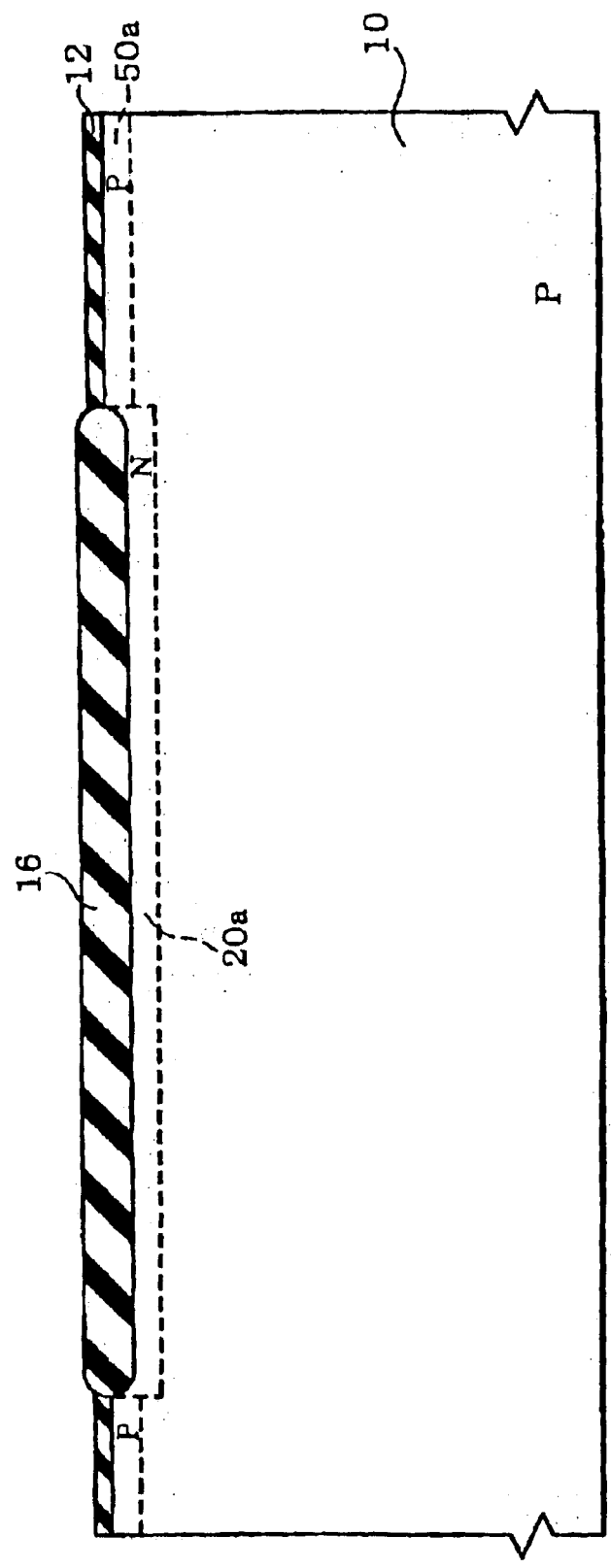
FIG. 3 shows a cross-sectional view indicating the method for manufacturing a semiconductor device in the process order in accordance with the embodiment of the present invention.

(B) As shown in FIGS. 2 and 3, after removing the resist layer R100, the semiconductor substrate 10 is thermally oxidized using the silicon nitride layer 14 as an anti-oxidation mask to form a LOCOS layer 16 having a thickness of about 500 nm on the N-type impurity layer 20a. Then, after removing the silicon nitride layer 14, boron ions are implanted in the semiconductor substrate 10 using the LOCOS layer 16 as a mask to form a P-type impurity layer 50a. The boron ions may be implanted with an acceleration voltage of 60 KeV, for example.

Figure 4:
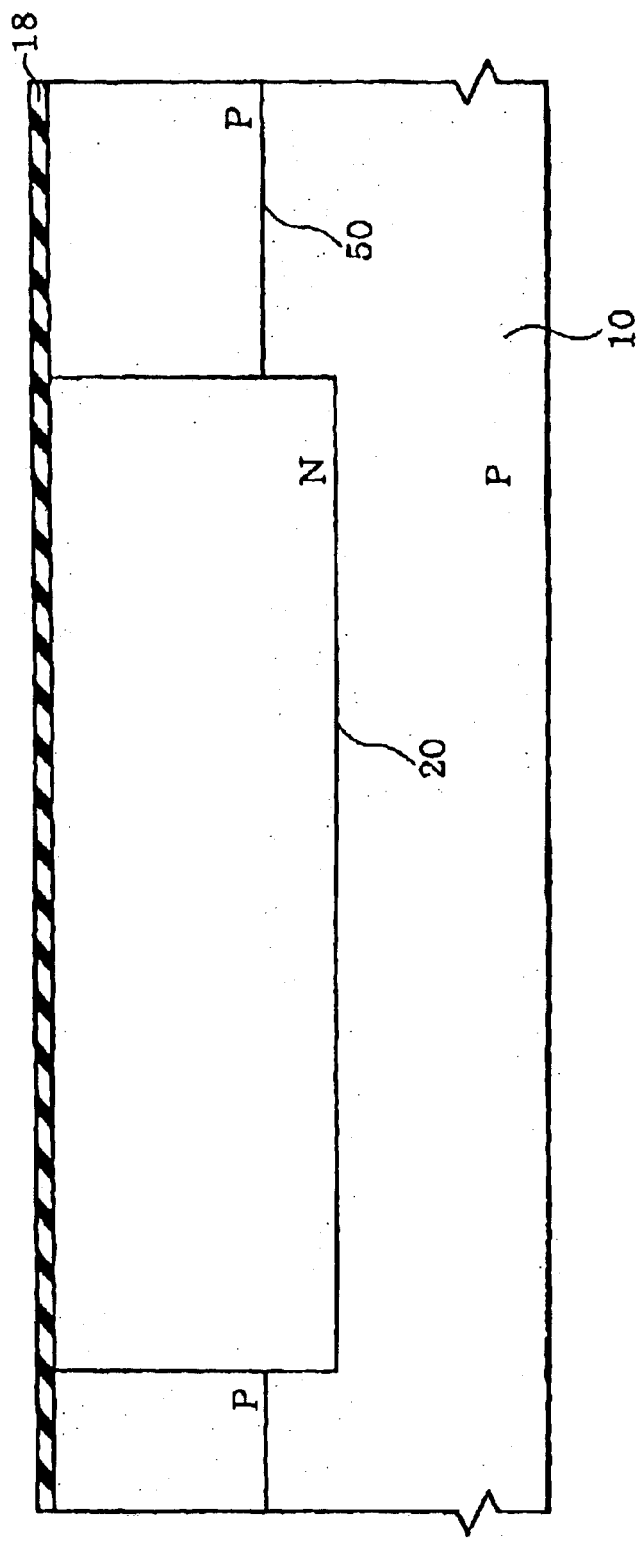
FIG. 4 shows a cross-sectional view indicating the method for manufacturing a semiconductor device in the process order in accordance with the embodiment of the present invention.

(C) As shown in FIG. 3 and FIG. 4, the impurities in the N-type impurity layer 20a and the P-type impurity layer 50a are diffused (driven in) by a heat treatment to form an N-type first well 20 and a P-type fourth well 50 in a self-alignment manner. Then, after removing the silicon oxide layer 12 and the LOCOS layer 16, a silicon oxide layer 18 is formed by a thermal oxidation over the semiconductor substrate 10.

Figure 5:
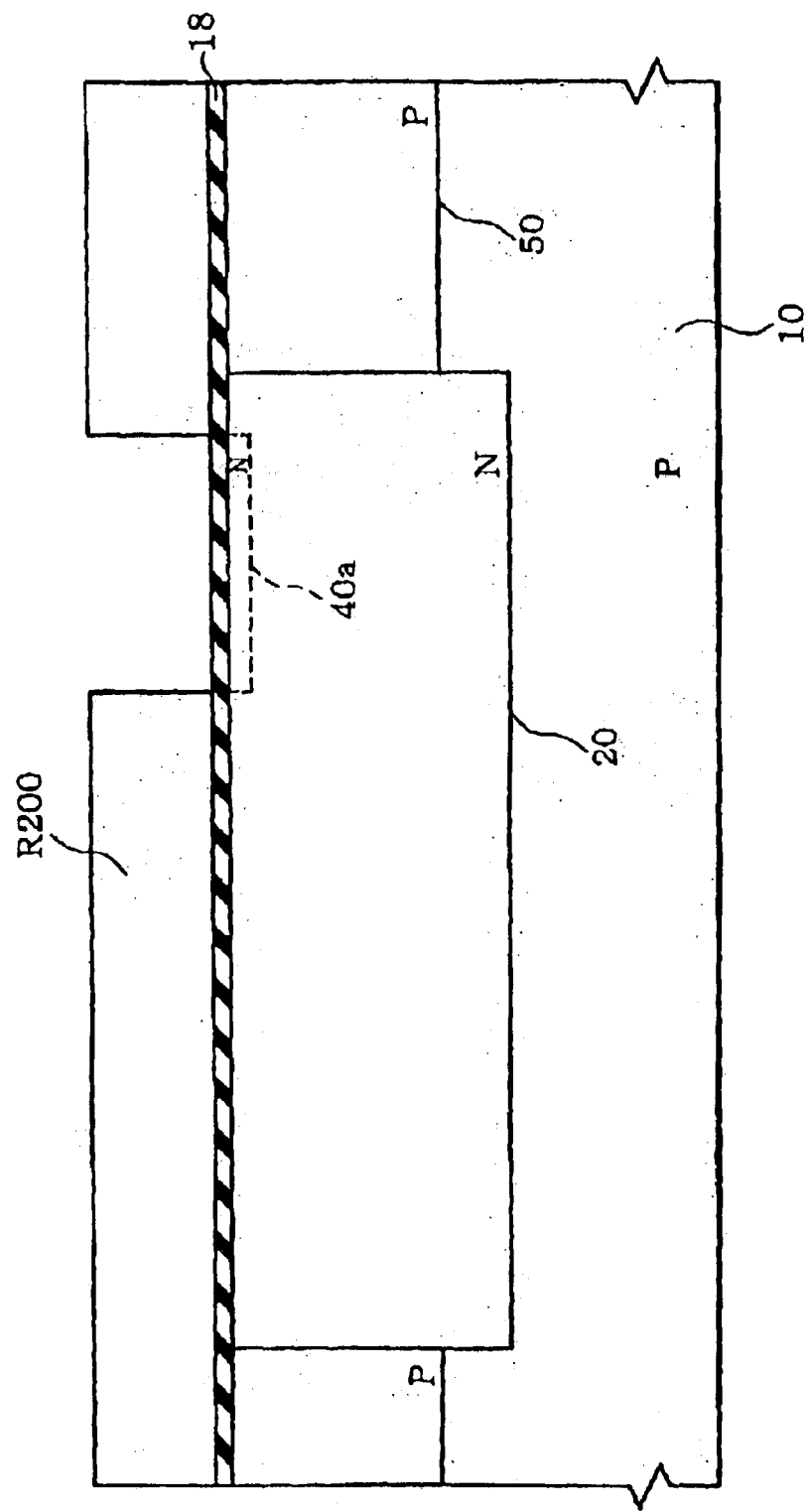
FIG. 5 shows a cross-sectional view indicating the method for manufacturing a semiconductor device in the process order in accordance with the embodiment of the present invention.

(D) As shown in FIG. 5, a resist layer R200 having an opening section provided at a position corresponding to a third well 40 (see FIG. 1) is formed over the silicon oxide layer 18. Phosphorus ions are implanted in a specified region of the N-type first well 20 using the resist layer R200 as a mask to form an N-type impurity layer (second impurity layer) 40a. In this instance, the phosphorus ions can be implanted with an acceleration voltage of 120 KeV, for example.

Figure 6:
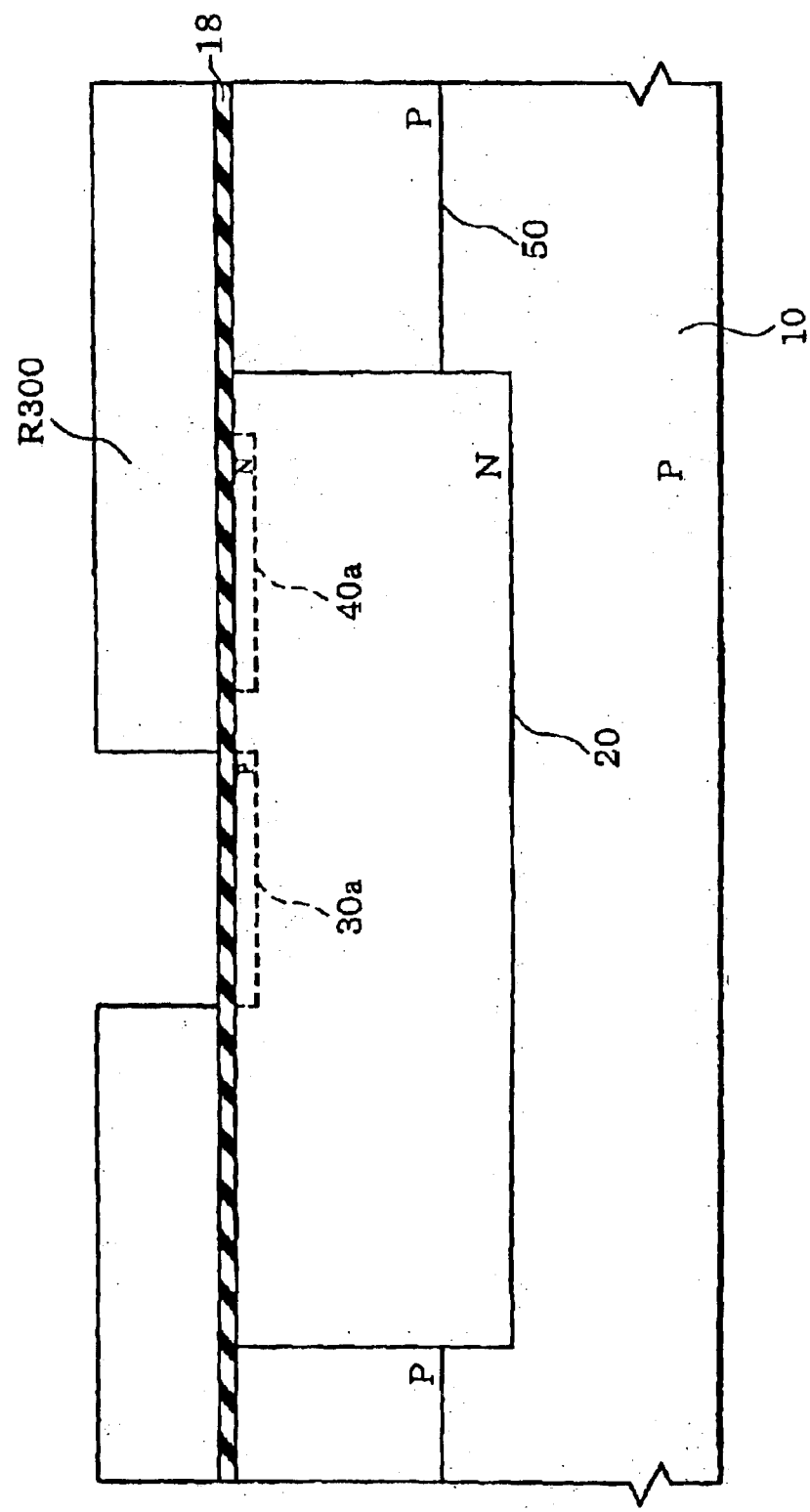
FIG. 6 shows a cross-sectional view indicating the method for manufacturing a semiconductor device in the process order in accordance with the embodiment of the present invention.

(E) As shown in FIG. 6, after removing the resist layer R200, a resist layer R300 having an opening section provided at a position corresponding to a second well 30 (see FIG. 1) is formed over the silicon oxide layer 18. Boron ions are implanted in a specified region of the first well 20 using the resist layer R300 as a mask to form a P-type impurity layer (first impurity layer) 30a. In this instance, the boron ions can be implanted with an acceleration voltage of 60 KeV, for example. Then, the resist layer R300 is removed.

Figure 7:
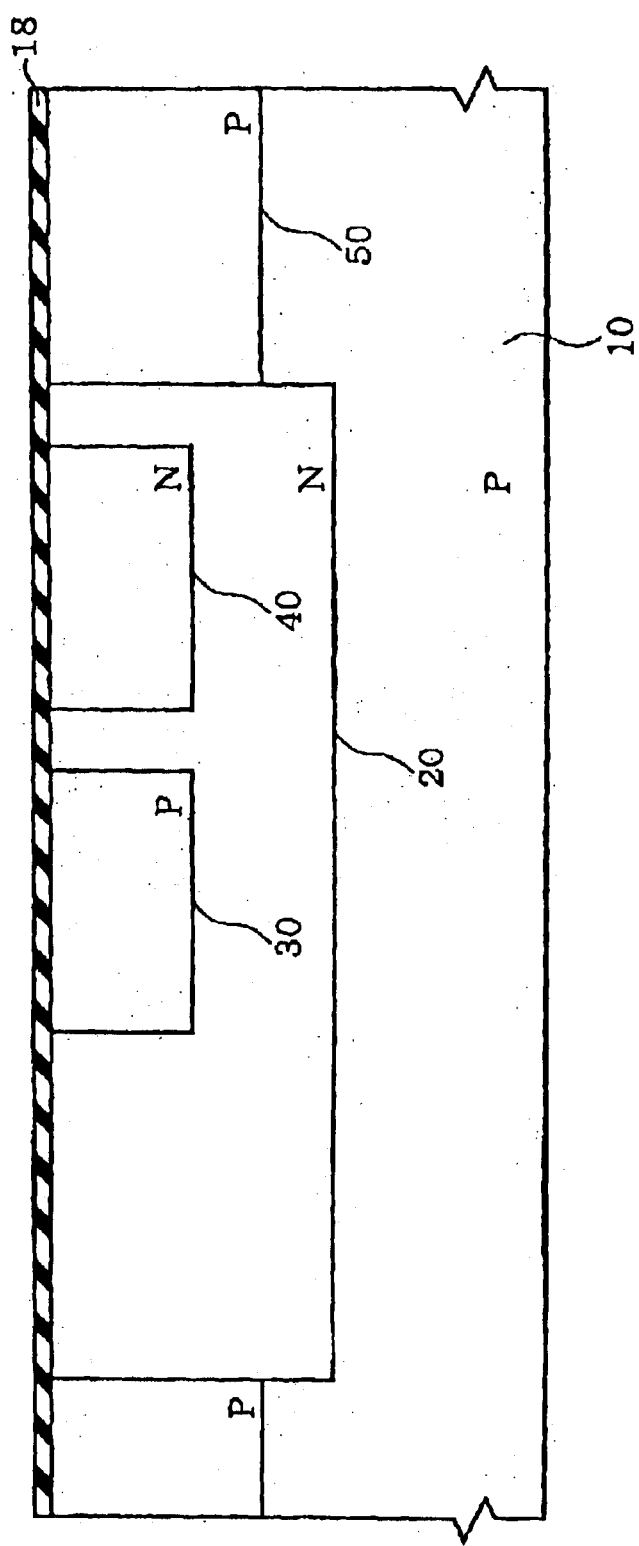
FIG. 7 shows a cross-sectional view indicating the method for manufacturing a semiconductor device in the process order in accordance with the embodiment of the present invention.

(F) As shown in FIG. 6 and FIG. 7, the impurities in the P-type impurity layer 30a and the N-type impurity layer 40a are simultaneously diffused (driven in) by a heat treatment to form a P-type second well 30 and an N-type third well 40. In this instance, the impurities in the first well 20 and the fourth well 50 are also simultaneously diffused.

In this manner, the N-type first well 20 and the P-type second well 30 and the N-type third well 40 formed within the first well 20 are formed in the P-type semiconductor substrate 10. Further, the P-type fourth well 50 adjacent to the first well 20 is also formed. It is noted that the order of step (D) and step (E) can be reversed if desired.

Then, element isolation dielectric layers, gate dielectric layers, gate electrodes, source/drain layers and the like are formed by known methods to form specified transistors. More specifically, as shown in FIG. 1, an N-channel type low breakdown voltage transistor 100NL is formed in the second well 30, and a P-channel type low breakdown voltage transistor 200PL is formed in the third well 40. Also, a P-channel type high breakdown voltage transistor 400PH is formed in the first well 20, and an N-channel type high breakdown voltage transistor 300NH is formed in the fourth well 50.

By the manufacturing method in accordance with the present embodiment, the first well 20 where the high breakdown voltage transistor 400PH is formed, and the second well 30 and the third well 40 where the low breakdown voltage transistors 100NL and 200PL are located are formed in different steps. As a result, the second well 30 and the third well 40 can be designed independently of the first well 20.

By the manufacturing method in accordance with the present embodiment, by the heat treatment in step (F), the P-type second well 30 and the N-type third well 40 can be simultaneously formed by diffusing the impurities in the impurity layer 30a and the impurity layer 40a. Also, by the manufacturing method in accordance with the present embodiment, by the heat treatment in step (C), the N-type second well 20 and the P-type fourth well 50 can be simultaneously formed by diffusing the impurities in the impurity layer 20a and the impurity layer 50a.

The present invention is not limited to the embodiment described above, and many modifications can be made within the scope of the subject matter of the present invention. For example, the embodiment described above shows an example in which the first conductivity type is P-type and the second conductivity type is N-type. However, these conductivity types may be reversed if desired. Also, the layer structure or plan structure of the semiconductor device can be different from those of the embodiment described above depending on the design of devices.

The entire disclosure of Japanese Patent Application No. 2002-063537 filed Mar. 8, 2002 is incorporated by reference herein.

What is claimed is:

1. A semiconductor device comprising:
   a semiconductor substrate of a first conductivity type;
   a first well of a second conductivity type formed in the semiconductor substrate;
   a second well of the first conductivity type formed within the first well;
   a third well of the second conductivity type formed within the first well;
   a low breakdown voltage transistor of the second conductivity type formed at the second well;
   a low breakdown voltage transistor of the first conductivity type formed at the third well; and
   a high breakdown voltage transistor of the first conductivity type formed at the first well,
   wherein the second well and the third well have an impurity concentration higher than an impurity concentration of the first well.

2. A semiconductor device according to claim 1, further comprising a fourth well of the first conductivity type formed in the semiconductor substrate, and a high breakdown voltage transistor of the second conductivity type formed at the fourth well.

3. A semiconductor device according to claim 1, wherein a ratio of the breakdown voltages of the low breakdown voltage transistor and the high breakdown voltage transistor is about 3 to 60.

4. A semiconductor device according to claim 1, wherein a ratio of the depths of the second well and the third well with respect to the first well is about 2 to 5, respectively.

5. A semiconductor device according to claim 1, wherein the high breakdown voltage transistor has an offset gate structure.

* * * * *